United States Patent
Masuda et al.

(10) Patent No.: US 6,506,686 B2
(45) Date of Patent: Jan. 14, 2003

(54) PLASMA PROCESSING APPARATUS AND PLASMA PROCESSING METHOD (75) Inventors: Toshio Masuda, Toride (JP); Kazue Takahashi, Kudamatsu (JP); Ryoji Fukuyama, Kudamatsu (JP); Tomoyuki Tamura, Kudamatsu (JP)

(73) Assignee: Hitachi, Ltd., Tokyo (JP)

(*) Notice: Subject to any disclaimer, the term of this patent is extended or adjusted under 35 U.S.C. 154(b) by 13 days.

(21) Appl. No.: 09/790,702

(22) Filed: Feb. 23, 2001

(65) Prior Publication Data
US 2001/0018951 A1 Sep. 6, 2001

(30) Foreign Application Priority Data
Mar. 6, 2000 (JP) ........................................ 2000-065769

(51) Int. Cl.⁷ .............................................. H01L 21/00
(52) U.S. Cl. ............. 438/715; 156/345.44; 156/345.46; 156/345.48; 156/345.49; 216/68; 216/70; 438/729
(58) Field of Search .................. 156/345 P, 345 C, 156/345 ME, 345 MG, 345 PH; 438/710, 715, 728, 729, 732; 216/67, 70, 71, 68

(56) References Cited

U.S. PATENT DOCUMENTS 5,846,885 A * 12/1998 Kamata et al. ............. 438/729
6,251,792 B1 * 6/2001 Collins et al. .............. 438/729

FOREIGN PATENT DOCUMENTS

| JP | 5-275385 | * 10/1993 |
| JP | 8-144072 | * 6/1996 |
| JP | 11-340149 | * 12/1999 |

* cited by examiner

Primary Examiner—William A. Powell
(74) Attorney, Agent, or Firm—Antonelli, Terry, Stout & Kraus, LLP (57) ABSTRACT In a plasma processing apparatus that has a vacuum chamber, a process gas supply means of supply gas to a processing chamber, an electrode to hold a sample inside said vacuum chamber, a plasma generator installed in said vacuum chamber opposite to said sample, and a vacuum exhaust system to decrease pressure of said vacuum chamber, a bias voltage of Vdc=−300 to −50 V is applied and the surface temperature of said plate ranges from 100 to 200° C. In addition, the surface temperature fluctuation of the silicon-made plate in said plasma processing apparatus is kept within ±25° C.

10 Claims, 7 Drawing Sheets

PLASMA PROCESSING APPARATUS AND PLASMA PROCESSING METHOD

BACKGROUND OF THE INVENTION

1. Field of the Invention

The present invention relates to a plasma processing apparatus and processing method, particularly to a plasma processing apparatus and processing method suitable for formation of ultrafine pattern in semiconductor production process.

2. Related Background Art

In semiconductor production process, a plasma processing apparatus is widely used in fine processing such as etching, film formation and ashing. In plasma processing, process gas introduced into a vacuum chamber (reactor) is converted to plasma by a plasma generation means, and is made to react on the semiconductor wafer surface to provide fine processing, and volatile reaction products are exhausted, thus a predetermined process is performed.

This plasma processing is strongly affected by temperature of the reactor inner wall and wafer and deposition of reaction products on the inner wall. Furthermore, if the reaction products deposited inside the reactor have peeled off, partilcle may be produced, resulting in deterioration of device characteristics or reduction of yields. In the plasma processing apparatus, therefore, it is important to control temperature inside the reactor and deposition of reaction products on the surface, in order to ensure process stability and to prevent particle contamination.

For example, Official Gazette of Japanese Patent Laid-Open NO. 144072/1996 discloses a dry etching apparatus which controls and maintains the temperature of each part inside the reactor to a high temperature of 150 to 300° C. (preferably 200 to 250° C.), at least 150° C. higher than that of etching stage, within the accuracy of ±5° C., wherein the purpose is to improve the selectivity in a silicon oxide dry etching process. This is intended to reduce deposition of plasma polymer on the inner wall of the reactor by controlling each part inside the reactor to high temperature, thereby increase the deposition of plasma polymer on the semiconductor wafer, with the result of improved selectivity.

Also, Official Gazette of Japanese Patent Laid-Open NO. 275385/1993 discloses a parallel plate plasma processing apparatus wherein a heating means is provided on at least one of a clamp ring (object holding means) or focus ring (plasma concentration means) to raise and keep the temperature in order to prevent deposition of plasma process reaction products. As a heating means, a resistance heater is used. Since deposition of reaction products can be prevented by heating, peeling off of reaction products and particles on the object surface are reduced.

However, when the reactor inner wall is set to a high temperature of 200 to 250° C. or more as described above, a problem arises that etching characteristics becomes very sensitive to the temperature of the inner wall surface, and repeatability and reliability of the process can be reduced.

For example, S. C. McNevin, et al., J. Vac. Sci. Technol. B15(2) March/April 1997, P.21, "Chemical challenge of submicron oxide etching" indicates that oxide film etching rate increases 5% or more, in the inductively coupled plasma when side wall temperature changes from 200 to 170° C., therefore, surface temperature inside the reactor is required to be kept to a high accuracy of 250 ±2° C. in order to ensure stability of process characteristics.

Furthermore, since the surface of the processing chamber inner wall is exposed to high density plasma, it is not easy to control the wall surface temperature with high accuracy in the high temperature range. A highly accurate in-situ temperature measuring means and a heating means such as resistance heater or lamp are to be used for temperature control. However, the temperature control mechanism and means will be quite complicated and large in scale, resulting in complicated equipment with high cost. In a high temperature range of more than 200° C., another problem exists that the materials applicable for the inner wall are limited.

In this respect, the present applicants discloses in the Japanese Patent Application No. 147672/1998 (Official Gazette of Japanese Patent Laid-Open NO. 340149/1999) by the same applicants that the process can be insensitive to temperature changes and stable process repeatability can be ensured despite the temperature accuracy of about ±10° C., when the temperature of the processing chamber inner wall is set to the temperature range of lower than 100° C., wherein said applicants use a magnetic field UHF band electromagnetic wave radiation discharge type plasma etching apparatus as one Embodiment.

The same application discloses that, by applying bias at least partly to the components (or inner wall surface) in contact with plasma, and by reducing the thermal capacity of the components to keep component temperature in the range from 150 to 250° C., it is possible to come to the level that the temperature fluctuation of components does not affect the process substantially.

The present applicants in the Japanese Patent Application No. 232132/1999 by the same applicants also disclose that, when higher bias power of no deposition occurrence is applied to the silicon-made focus ring set outside the sample, and when the surface temperature is higher than 150° C., surface reaction dependency upon temperature on the silicon surface is reduced and stable process repeatability can be ensured.

However, as for the plate installed on the top antenna (or upper electrode or top plate) opposite to the sample wafer, although the plate has a big influence on process stability, said application only states that the plate has a role of stabilizing the process by preventing reaction product from deposition by application of bias, and said applicants did not reach sufficient understanding of the mechanism nor succeed in quantifying the required conditions.

SUMMARY OF THE INVENTION

From said technological standpoint, the present inventors made a strenuous effort to solve said problems, and found out temperature range and accuracy required to ensure process stability and requirements for surface state control by bias application, regarding the top plate installed opposite to the sample wafer.

The present invention was developed on the basis of the aforementioned findings, and is intended to provide a plasma processing apparatus and processing method with excellent process stability and repeatability.

The present invention provides a plasma processing apparatus comprising; a vacuum chamber, a process gas supply means to supply gas to said vacuum chamber, an electrode to hold a sample inside said vacuum chamber, a plasma generator installed in said vacuum chamber opposite to said sample, and a vacuum exhaust system to evacuate said vacuum chamber;

wherein said plasma generator is installed a silicon-made plate inside the processing chamber, and bias voltage of Vdc=−50 to −300 V (i.e. −300 V≦Vdc≦−50 V) is applied to said silicon-made plate, and the surface temperature of said plate is kept in the range from 100 to 200° C.

Another characteristic of the present invention is that the fluctuation of the surface temperature of the silicon-made plate on said plasma processing apparatus is kept within ±25° C.

Still further characteristic of the present invention is that said plasma generator of plasma processing apparatus is based on magnetic field or non-magnetic field UHF band electromagnetic wave radiation discharge method in the frequency range from 300 MHz to 1 GHz, and that the resistivity of said silicon-made plate is 1 to 10 Ωcm, and that the thickness of said silicon-made plate is 5 to 20 mm, desirably up to 10 mm.

According to the present invention, dependency of reaction on temperature on the silicon surface decreases by temperature control and bias application for silicon-made plate installed opposite to the sample and plasma state and process characteristics are stabilized for surface temperature fluctuation of the plate within ±25° C., thus a plasma processing apparatus and processing method with excellent stability and repeatability can be provided.

The present invention is still further characterized as follows: the skin depth of the UHF band electromagnetic wave transmitting inside the silicon-made plate and silicon plate thickness are almost equal, and current resulting from UHF band electromagnetic wave flows the entire plate. As a result, the plate is effectively heated by self-heat generation due to the internal resistance of silicon itself, which enables to set surface temperature of the silicon-made plate in the range from 100 to 200° C. where dependency of surface reaction on temperature decreases. As a result plasma state and process characteristics are stabilized, thus a plasma processing apparatus and processing method with excellent stability and repeatability can be provided.

DETAILED DESCRIPTION OF PREFERRED EMBODIMENTS

The following describes the embodiments according to the present invention with reference to the drawings.

Figure 1:
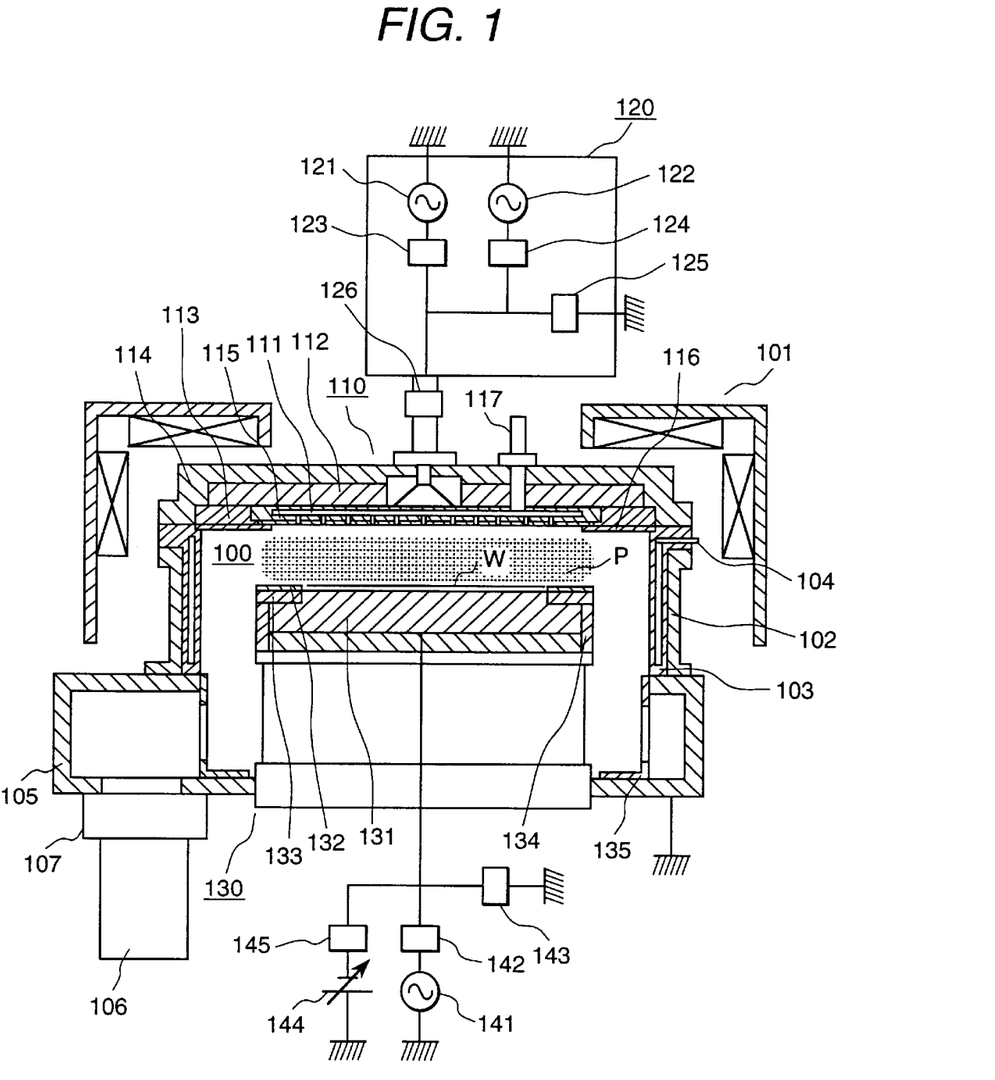
FIG. 1 is a schematic diagram representing the vertical section of the first Embodiment where the present invention is applied to a magnetic field UHF band electromagnetic wave radiation discharge type plasma processing apparatus.

FIG. 1 shows an embodiment where the present invention is applied to the magnetic field UHF band electromagnetic wave radiation discharge type plasma etching apparatus. It is a cross sectional view of said plasma etching apparatus in schematic form.

The processing chamber 100 in FIG. 1 is a vacuum vessel providing a vacuum of about $10^{-6}$ Torr. An antenna 110, which radiates electromagnetic wave, is installed on the top thereof, and a bottom electrode 130 to mount a sample W such as a wafer is installed on the bottom thereof. Antenna 110 and bottom electrode 130 are installed so as to be opposite to and in parallel with each other. A magnetic field forming means 101 composed of an electromagnetic coil and a yoke, for example, is installed around the processing chamber 100. Process gas introduced into the processing chamber is converted into plasma by interaction between the electromagnetic wave radiated from the antenna 110 and magnetic field produced by the magnetic field forming means 101, and plasma P is generated to perform processing of the sample W on the bottom electrode 130.

Evacuation of the processing chamber 100 is provided by vacuum exhaust apparatus 106 connected to vacuum chamber 105 and the inner pressure can be controlled by a pressure control means 107. The processing pressure is adjusted in the range from 0.1 to 10 Pa, more desirably from 0.5 to 4 Pa. The processing chamber 100 and the vacuum chamber 105 are at the ground potential. A side wall inner unit 103 having a temperature control function is replaceably installed on a side wall 102 of the processing chamber 100. The temperature on the inner surface is controlled by a heat transfer medium supplied in circulation to the side wall inner unit 103 from the heat transfer medium supply means 104. Alternatively, the temperature can be feedback-controlled by a heater mechanism and a temperature detecting means. The temperature control range is from 0 to 100° C., desirably 20 to 80° C., and is controlled within ±10° C. It is desirable that the side wall 102 of the processing chamber 100 and side wall inner unit 103 are made of non-magnetic metallic material without containing heavy metal, featuring high thermal conductivity, for example aluminum, and that the surface is provided with surface process of anti-plasma, for example anodized aluminum oxide or the like.

Antenna 110 installed on the vacuum vessel consists of a disk formed conductor 111, a dielectric 112 and a dielectric ring 113, and is held by a housing 114 as a part of the vacuum vessel. Furthermore, a plate 115 is installed on the surface of the disk formed conductor 111 on the side in contact with plasma. A outer ring 116 is installed further on the outside. The temperature of the disk formed conductor 111 is kept at a predetermined value by a temperature control means (not illustrated), namely by heat transfer medium circulating inside, and the surface temperature of the plate 115 in contact with the disk formed conductor 111 is controlled. The process gas used to perform sample etching and film formation is supplied at a predetermined flow rate and mixing ratio from the gas supply means 117 and is introduced into processing chamber through numerous holes provided on the disk formed conductor 111 and the plate 115, controlled to a designed distribution.

The antenna 110 is connected to an antenna power source 121 and antenna bias power source 122 as an antenna power system 120 through matching circuit-filter systems 122 and 124, and is also connected to the ground through a filter 125. The antenna power source 121 supplies power at a UHF band frequency in the range from 300 MHz to 1 GHz. By setting diameter of the disk formed conductor 111 to a specified characteristic length, inherent excitation mode, such as TM01 mode, is formed. In the present Embodiment, frequency of the antenna power source 121 is 450 MHz, and the diameter of the disk formed conductor 111 is 330 mm.

Meanwhile, the antenna bias power source 122 controls the reaction on the surface of the plate 115 by applying bias power at a frequency in the range from several tens of kHz to several tens of MHz to the antenna 110. Particularly in case of oxide film etching using CF-series gas, use of high purity silicon as a material of the plate 115 enables the reaction of F radical and CFx radical to be controlled, thus radical composition ratio can be adjusted. In this Embodiment, antenna bias power source 122 is set at a frequency of 13.56 MHz and a power of 50 W to 600 W. In this case, bias voltage Vdc is generated to the plate 115 due to self-bias. The Vdc value is about Vdc=−300 V to −50 V (i.e. −300 V$\leq$Vdc$\leq$−50 V), although it may vary with plasma density and pressure. The present Embodiment is characterized in the point that the self-bias applied to the plate 115 is controlled independent of the plasma generation, unlike so-called parallel plate capacitively coupled plasma system. Especially, by setting the bias voltage to a low value of Vdc=−100 V or less (for example −10 V) (i.e. −100 V$\leq$Vdc$\leq$−10 V), it becomes possible to reduce silicon consumption, resulting in running cost reduction, and becomes also possible to reduce silicon sputtering, which results in less etching residue on the sample W.

The distance between the bottom of the plate 115 and the sample W (hereafter called "gap") is in the range of 30 to 150 mm, or desirably 50 to 120 mm. Since the plate 115 having wide area is placed opposite to the sample W, it has the biggest influence to the process. The major point of the present invention is to stabilize surface reaction on the plate 115, and to get process characteristics with excellent repeatability by bias application to the surface of the plate 115 and by temperature control within a specific range. This will be described later in details.

On the bottom of the processing chamber 100, a bottom electrode 130 is installed opposite to the antenna 110. To the bottom electrode 130, a bias power source 141 is connected through matching circuit filter system 142. The bias power source 141 supplies bias power in the range from 400 kHz to 13.56 MHz, for example, and controls the bias applied to the sample W. The bottom electrode 130 is connected to the ground through filter 143. In the present Embodiment, frequency of the bias power source 141 is set to 800 kHz.

On the top surface of the bottom electrode 130, namely, on the sample mounting surface, a sample W such as a wafer is mounted on an electrostatic chucking unit 131. Electrostatic chucking dielectric layer (hereafter called "electrostatic chucking film") is formed on the surface of the electrostatic chucking unit 131. By applying hundreds of volts to several kilovolts (kV) of DC voltage from an electrostatic chucking DC power supply 144 through filter 145, sample W is chucked and held on the bottom electrode 130 by electrostatic chucking force. As for the electrostatic chucking film, dielectric of aluminum oxide or aluminum oxide mixed with titanium oxide is used. Surface temperature of the electrostatic chucking unit 131 is controlled by temperature control means (not illustrated). Inactive gas, for example helium gas, set to a specified flow rate and pressure, is supplied to the surface of the electrostatic chucking unit 131, and raise heat conductivity with the sample W. This allows surface temperature of the sample W to be controlled with high precision in the range from about 100 to 110° C., for example. On the top surface of the electrostatic chucking unit 131, a focus ring 132, a ring formed member made of high purity silicon, is installed outside the sample W. The focus ring 132 is isolated from electrostatic chucking unit 131 by an insulator 133. An electrode outer cover 134 is settled outside the electrode. Alumina and quartz are suitable for the insulator 133 and the electrode outer cover 134. In this Embodiment, alumina is used for the insulator 133 and electrode outer cover 134. This configuration enables bias power applied to the bottom electrode to be applied to the focus ring 132 by partial leakage through the insulator 133. Intensity of the bias applied to the focus ring 132 can be adjusted according to dielectric constant and thickness of the insulator 133. The focus ring 132 is thermally isolated from the insulator 133, and is not in thermal contact. This enables highly efficient temperature rise through heating by plasma and bias. Furthermore, use of silicon as material of the focus ring 132 allows scavenging function of the silicon on the surface of focus ring 132 to adjust the reaction of F radical and CFx radical or radical composition. This makes it possible to adjust etching uniformity, especially on the outer periphery of the wafer.

The plasma etching apparatus according to the present Embodiment is structured as described above. Regarding the temperature control of the side wall in the above Embodiments, the results disclosed in the Japanese Patent Application No. 14767/1998 by the applicants of the present invention can be used. Likewise, regarding the focus ring structure, what is disclosed in the Japanese Patent Application No. 232132/1999 by the applicants of the present invention can be employed.

With reference to FIG. 1, the following describes a process of etching silicon oxide film as an example, using this plasma etching apparatus:

Firstly, the wafer W as an object of processing is loaded into the processing chamber 100 from a sample loading mechanism (not illustrated) and is mounted on the bottom electrode 130 and chucked thereon. The height of the lower electrode is adjusted, and the gap is set to a predetermined value. Then gases required for sample W etching process, for example, $C_4F_8$, Ar and $O_2$ are supplied into the processing chamber 100 from gas supply means 117 through the plate 115 at a predetermined flow rate and mixing ratio. At the same time, the pressure inside the processing chamber 100 is adjusted to a predetermined processing pressure by the vacuum exhaust system 106 and the pressure control means 107. Then 450 MHz UHF power is supplied from the antenna power supply 121, and electromagnetic wave is radiated from the antenna 110. Plasma is generated inside the processing chamber 100 by interaction with approximately horizontal magnetic field of 160 gausses (electron cyclotron resonance magnetic field intensity for 450 MHz) formed inside the processing chamber 100 by the magnetic field forming means 101. Process gas is dissociated to generate ion and radical. Composition and energy of ion and radical in plasma are controlled by antenna bias power from the antenna bias power source 122 and bias power from the bias power supply 141 of the bottom electrode, and etching process is performed to the wafer W. Then, upon completion of etching, supply of power, magnetic field and process gas are terminated, and etching process is completed.

The plasma processing apparatus in the present Embodiment is structured as described above. The following describes a specific method for controlling the temperature of the plate 115 by the system in the present Embodiment. After considering temperature setting of the plate 115, result of temperature measurement of the plate 115 will be shown.

Figure 2:
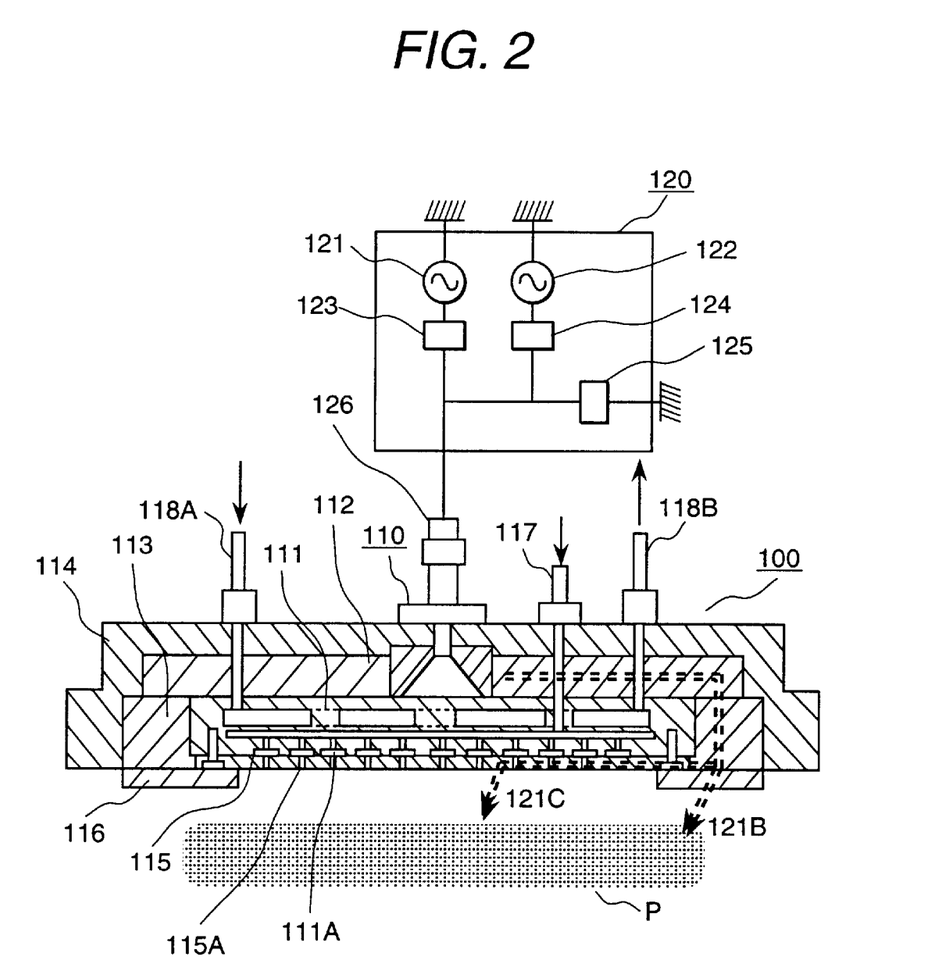
FIG. 2 is a schematic diagram representing the vertical section of the embodiment of an antenna structure according to the first Embodiment.

Firstly, with reference to FIG. 2, the following describes the method for controlling the temperature of plate 115, namely, a cooling and heating mechanism. FIG. 2 is a detailed cross sectional view of antenna 110 shown in FIG. 1. It represents an arrangement for temperature control of the plate 115. As explained with reference to FIG. 1, the antenna 110 comprises a disk formed conductor 111, dielectric 112 and dielectric ring 113. The plate 115 is installed on the side of the disk formed conductor 111 in contact with plasma. The plate 115 is settled to the disk formed conductor 111 by means of setscrews on the periphery.

The following describes the cooling mechanism of the plate 115: Temperature of the disk formed conductor 111 installed on the back of the plate 115 is controlled at a predetermined value with the heat transfer medium, which is introduced into disk formed conductor 111 from inlet 118A and discharged, after circulating inside, from the outlet 118B. The material of the disk formed conductor 111 is desirably aluminum with high thermal conductivity. The temperature of the heat transfer medium is desirably normal temperature, for example 30° C. Meanwhile, process gas is supplied to the disk formed conductor 111 from the gas supply means 117. After dispersed inside the disk formed conductor 111, the process gas is supplied into the processing chamber through numerous gas holes provided on the plate 115. Accordingly, during the processing, the process gas exists between the plate 115 and the disk-formed conductor 111. The temperature of the plate 115 is adjusted by cooling from the disk formed conductor 111 with heat transfer of the process gas. Furthermore, in the Embodiment shown in FIG. 2, a space 111A is provided on the surface of the disk formed conductor 111 on the side in contact with the plate 115, and the process gas accumulated there increases heat transfer efficiency between the disk formed conductor 111 and the plate 115, to ensure that the plate 115 is cooled with high efficiency. The diameter of the gas hole is 2 mm for the disk formed conductor 111, and 0.5 mm for the plate 115.

On the other hand, heating mechanism of the plate 115 consists of plasma heating from plasma P, ion heating by antenna bias and self-heat generation of the plate 115 itself.

The plasma heating is, needless to say, heating that the plate 115 is heated by high temperature electrons and ions in plasma P.

The ion heating is heating by energy of ion pulled into the plate 115. Radio frequency antenna bias is applied to the antenna 110 by antenna bias power source 122, and bias voltage Vdc is generated by self-bias. Antenna bias power is approximately in the range from 50 to 600 W, and self-bias of about Vdc=−300 to −50 V is applied to the plate 115. Ions are pulled in by this energy to heat the plate 115.

Self-heat generation of the plate 115 is resistance heating by internal resistivity of silicon as a material of the plate 115. UHF band frequency electromagnetic wave (hereafter called "UHF wave") supplied from antenna power source 121 transmits in the dielectric 112 as indicated by 121A, and is discharged into the processing chamber 100 from the dielectric ring 113 (as indicated by 121B), meantime UHF wave transmits in the plate 115 and is discharged into the processing chamber 100 from the surface of the plate 115 (indicated by 121C).

Now, propagation of the UHF wave through the plate 115 greatly varies according to the resistivity of the plate 115. The resistivity of silicon, as a material of the plate 115, can be adjusted by the amount of B (boron) to be added, and can be set to, for example, about 5 Ωcm at concentration of about $10^{14}$, and about 0.01 Ωcm at B concentration of from $10^{18}$ to $10^{19}$.

In case of silicon resistivity of 5 Ωcm, skin depth of 450 MHz UHF frequency electromagnetic wave is about 7 mm. In other words, the UHF wave current transmits through the area to a depth of about 7 mm from surface. On the other hand, thickness of the plate 115 is desirably in the range from 5 to 20 mm according to the flexible rigidity and strength of the plate, and is more desirably to be about 10 mm or less when considering the cost of material and production. As a result, thickness of the plate 115 is about twice the skin depth at most, thus the UHF wave current transmits throughout the entire plate interior. In this case, since resistivity of the silicon plate 115 is as high as 5 Ωcm, Joule heating is generated by the current. This phenomenon particularly occurs at the silicon resistivity of 1 to 10 Ωcm. In other words, in case of silicon resistivity of 1 to 10 Ωcm for 450 MHz UHF frequency, self-heat generation occurs due to the resistance heating by UHF wave current which transmits inside the plate, as a result temperature of the plate 115 increases.

In case that the silicon resistivity is as low as 0.01 Ωcm, skin depth for 450 MHz UHF frequency is about 0.1 to 0.5 mm. In this case, UHF wave current transmits the top surface of the plate 115, accordingly self heat generation hardly occurs to the plate 115 because of the current concentrated to the top surface and low silicon resistivity. As described above, the self-heat generation of the plate 115 greatly differs according to the resistivity of the silicon as a material.

Herein above, mechanism of temperature rise and fall of the silicon plate 115 in the Embodiment shown in FIG. 1 has been clarified. The temperature of the plate 115 is controlled to a predetermined value by adjusting the balance of these mechanisms. In the following, temperature setting of the plate 115 will be considered.

In qualitative terms, it can be easily supposed that, at low temperature of the plate 115, reaction products are more likely to deposit on the plate surface and the surface state tends to change with time. Moreover, the deposited reaction products may result in a source of particle contamination when peeled off. However, not only that, the present inventors have found out that dependency of the reaction state on the silicon surface upon temperature change increases, particularly when the temperature of the plate 115 is lower than 100° C. This will be explained with reference to FIG. 3.

Figure 3:
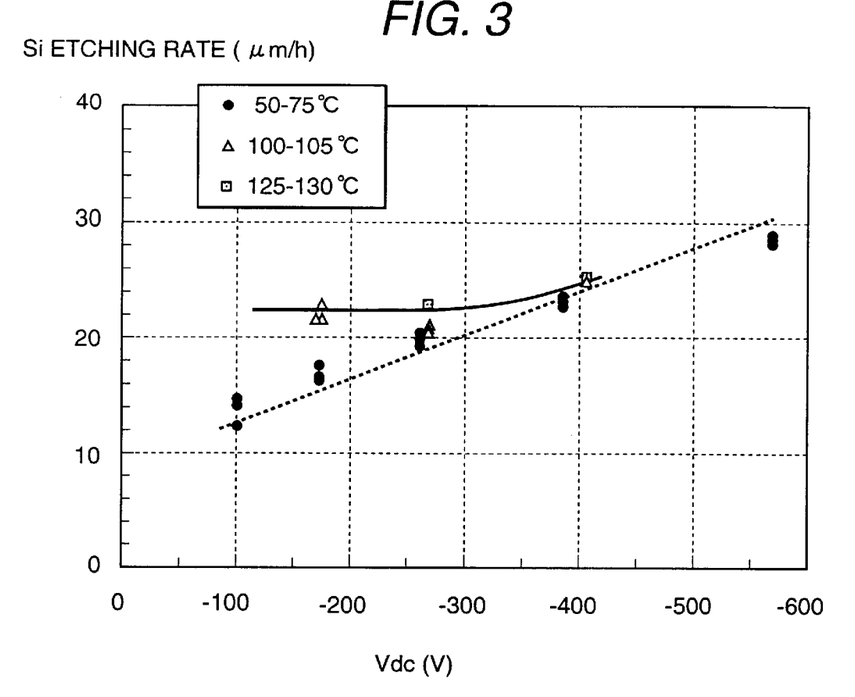
FIG. 3 shows the result of evaluating consumption rate of the plate in the first Embodiment.

FIG. 3 shows the result of evaluating the influence of the applied bias and the surface temperature upon consumption rate of the silicon plate. The consumption rate is used to indicate reaction at the silicon plate surface. This is an experimental result conducted to quantify the silicon consumption rate in the Embodiment shown in FIG. 1. In this experiment, after one hour of discharge operation (20 cycles of 3 minutes discharge on and 1 minute discharge off), the silicon consumption rate (i.e. etching rate) was evaluated by measuring the etched amount of silicon with a step meter. The bias voltage (Vdc) applied to the silicon and the silicon temperature were used as parameters. The silicon temperature was set by circulator temperature and gas pressure of the electrostatic chuck. Thermo-label affixed on the surface was used to measure the surface temperature.

As can be seen from FIG. 3, when the silicon temperature is as low as 50 to 70° C., the silicon consumption rate reduces as the absolute value of bias voltage (i.e. absolute value of Vdc |Vdc|) decreases. On the contrary, when the silicon temperature is as high as 100 to 105° C., or 125 to 130° C., the silicon consumption rate is kept almost constant even when |Vdc| decreases. This can be explained, qualitatively, as follows; since deposition rate of reaction products on the silicon surface is high at low surface temperature, ions reaching to the silicon surface are affected by the magnitude of |Vdc|, resulting in silicon consumption rate being more dependent on |Vdc|. On the contrary, when the silicon temperature is high, because of low deposition rate, etching reaction at silicon surface proceeds even at low |Vdc|.

Furthermore from different point of view, FIG. 3 indicates that the silicon consumption rate greatly differs from temperature of 50 to 70° C. to temperature of 100 to 105° C., when |Vdc| is small (for example, Vdc=−160 V). This indicates that the silicon consumption depends greatly on the changes of surface temperature. This tendency is thought to be more conspicuous when |Vdc| is as small as 50 V. On the contrary, when |Vdc| is more than 300 V, the silicon consumption is less subject to the influence of temperature changes. The reason is presumed as follows; when |Vdc| is low, because the deposited film on the silicon surface is not easily removed by ions, the silicon consumption is more affected by the dependency of deposition rate on temperature. On the contrary, when |Vdc| is high, deposited film on the silicon surface can be easily removed by ions, so that dependency of reaction temperature on the silicon surface decreases.

This result shows that silicon consumption rate is less affected by the applied bias (|Vdc|) and change of temperature at high applied bias and high temperature. It can be understood accordingly, that reaction on the silicon surface is stabilized at the window where these two conditions are satisfied. The above-mentioned result can be summarized as follows; in the range of Vdc=−300 V to −50 V, by setting the silicon plate surface temperature to be more than 100° C., surface reaction on silicon plate is less affected by the applied bias and the surface temperature.

On the other hand, in case of too high temperature of the plate 115, difference of the thermal expansion rates of silicon (material of the plate 115) and aluminum (material of the disk formed conductor 111) may cause sliding at the contact surface between the plate 115 and the disk formed conductor 111, and may result in crack of the plate 115. Although this critical temperature differs according to the design margin of the system, it is considered to be in the range from about 200 to 250° C. When considering temperature difference from disk formed conductor 111, it is desirable to set the temperature of the plate 115 to about 150° C. or at most to 200° C.

The above study has demonstrated that, when self-bias Vdc generated to the silicon-made plate 115 is in the range from Vdc=−300 to −50 V in the present Embodiment, it is desirable from the view point of process stability to set the surface temperature of the plate 115 in the range of 100 to 200° C., or more preferably to about 150° C. In the present Embodiment, the temperature of the plate 115 is adjusted to the designed value by optimizing the design parameters such as the resistivity and thickness of the silicon plate 115, refrigerant temperature and cooling efficiency of the disk formed conductor 111 and size of the gas hole.

Figure 4:
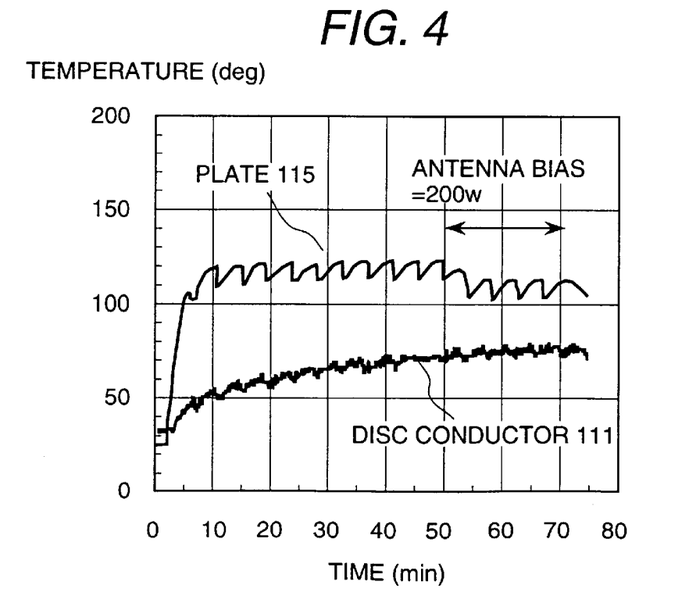
FIG. 4 represents the temperature fluctuation of the plate in the first Embodiment.
Figure 5:
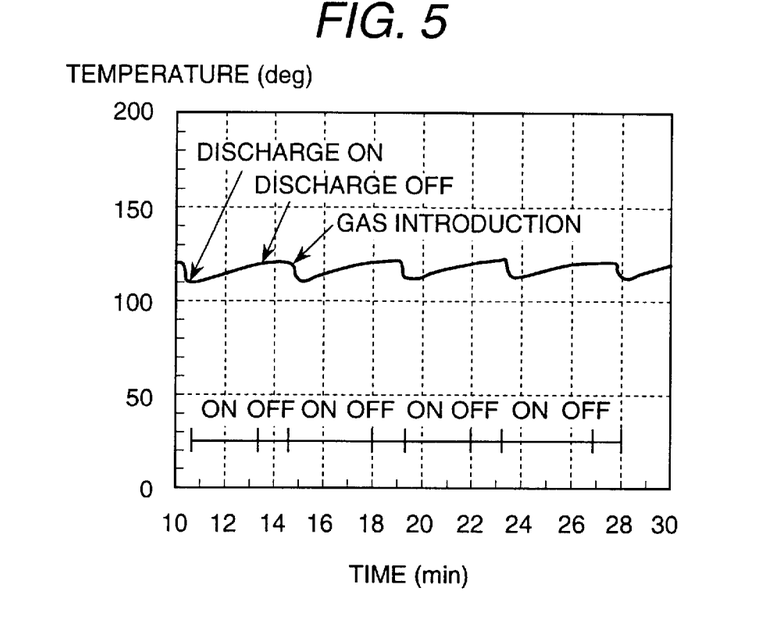
FIG. 5 represents the temperature fluctuation of the plate in the steady state in the first Embodiment.
Figure 6:
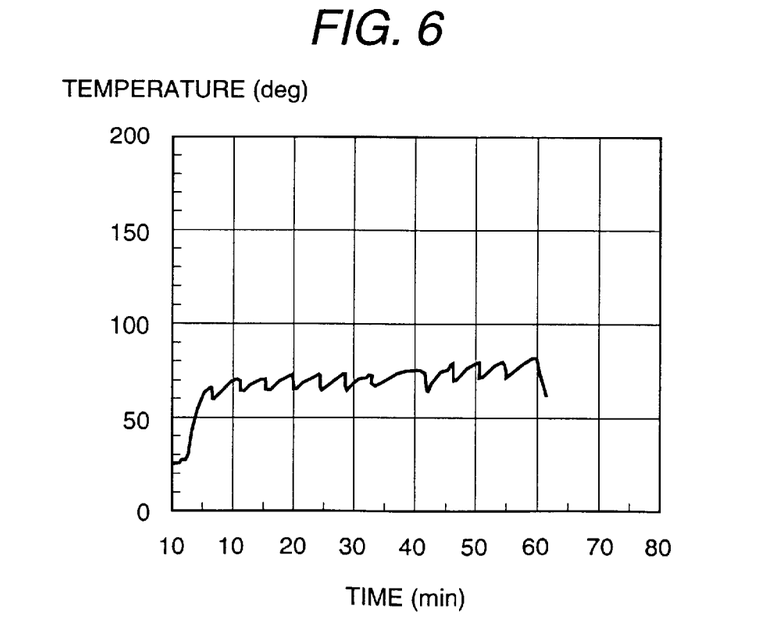
FIG. 6 represents the temperature fluctuation where the plate has different resistivity in the first Embodiment.

In the next, the following describes results of temperature measurement of the silicon-made plate 115 in the system according to the first Embodiment, with reference to FIGS. 4 to 6:

FIG. 4 shows temperature fluctuation of the plate 115 and the disk formed conductor 111 in a continuous processing test. The processing test was started without preheating and was performed by repeating cycle of 3-minutes discharge on and 1-minute discharge off continuously. The resistivity of the silicon plate 115 is 5 Ωcm. The processing condition is as follows:

Processing Condition A

Etching gas composition: $Ar/C_4F_8/O_2$=400/15/9 sccm

Gas pressure: 2.0 Pa, gap:70 mm

Power: antenna/antenna bias/bottom bias=1000 W/400 W/600 W

Temperature of the plate 115 was measured by mounting a fluorescent temperature sensor directly on inner (plasma side) surface of the plate 115. It has been confirmed that the temperature of the inner wall surface can be measured with the fluorescent temperature sensor accurately. At the starting of the continuous processing test, there was a rapid increase of the temperature of the plate 115. The temperature exceeded 100° C. at about 3 minutes after starting, then reached a steady state. In the meantime, the temperature of the disk formed conductor 111 gradually rose, and reached about 70° C. after 60 minutes. During the period, however, because of a balanced heat input and heat output, the temperature of the plate 115 exhibited a constant transition at about 110 to 120° C. After 60 minutes from starting, the antenna bias power source output was reduced from 400 to 200 W, and the temperature of the plate 115 fell down by about 10° C. This temperature difference indicates the effect of ion heating.

FIG. 5 shows the result of temperature change at short time scale accompanying the discharge on/off operations. In FIG. 5, steady state temperature of the plate 115 is shown. When discharge starts (Discharge ON), the temperature of the plate 115 rises from 110 to 120° C. in three minutes. When discharge stops at process end, temperature rise stops, however the temperature keeps a constant value without falling after that, and when process gas is introduced for next processing, the temperature drops. The reason is that, since process gas supply stops upon termination of processing, heat transfer by the process gas between the plate 115 and disk formed conductor 111 fully decreases. The above result shows that the gas heat transfer is highly effective for cooling the plate.

In the next, with reference to FIG. 6, the following describes the cases for different silicon resistivities: FIG. 6 shows the result of measuring the temperature change of the plate 115 when the resistivity of silicon plate 115 is as low as 0.01 Ωcm. Processing conditions are the same as those in FIG. 4 for resistivity of 5 Ωcm, however steady-state temperature is about 70° C., which is much lower than that in FIG. 4. This difference is caused by the effect of self-heat generation by silicon internal resistivity. Furthermore, this temperature of 70° C. is almost equal to saturation temperature of the disk formed conductor 111 shown in FIG. 4. This means that the arrangement according to the present Embodiment enables effective cooling against temperature rise by plasma heating and bias heating.

However, as discussed with reference to FIG. 3, the steady-state temperature range of about 70° C. is the range where silicon consumption rate, in other words, reaction state on the surface, is changeable by the change of bias voltage. Moreover, when the bias voltage is low, reaction products are likely to deposit on the surface, and the deposited film may cause particle contamination when peeled off. As has been described, this temperature range is not desirable from the viewpoint of processing reproducibility and prevention of particle contamination. On the other hand, as the disk formed conductor 111 is made of aluminum featuring excellent thermal conductivity, and the temperature is controlled by the circulating refrigerant, the temperature is kept at about 70° C. in the steady state, as shown in FIG. 4. Therefore, the temperature of the silicon-made plate 115 is required to be kept higher than that of the disk formed conductor 111. The self-heat generation due to the internal resistivity of the silicon has the advantage of efficient heating of the plate 115 without requiring a complicated heating mechanism, which enables temperature control of the plate 115 to a designed value.

Moreover, for low resistivity of 0.01 Ωcm, the skin depth is in the range from about 0.1 to 0.5 mm, as described above. In this case, UHF wave current concentrates on the top surface of the plate 115, resulting in micro-erosion occurrence on the silicon surface. As a result of study, the present inventors have found out that the resistivity is needed to be about 1 Ωcm or more in order to prevent erosion.

On the contrary, in case the resistivity of the plate 115 is too high, because loss of UHF wave transmitting in the plate 115 increases, and the intensity of the UHF wave discharged from center region of the plate 115 decreases, plasma distribution undergoes changes. To avoid this phenomenon, the desirable resistivity of the plate 115 is less than 20 Ωcm, or more desirably 10 Ωcm or less.

Because of the above reasons, it can be concluded that the suitable resistivity of the silicon of the plate 115 for 450 MHz UHF wave frequency is 1 to 20 Ωcm, more desirably 10 Ωcm or less and particularly about 5 Ωcm is the optimum.

In the following, required temperature control accuracy of the plate 115 during plasma processing will be examined from the viewpoint of temperature fluctuation influence of the plate 115 upon plasma chemistry and etching characteristics.

Figure 7:
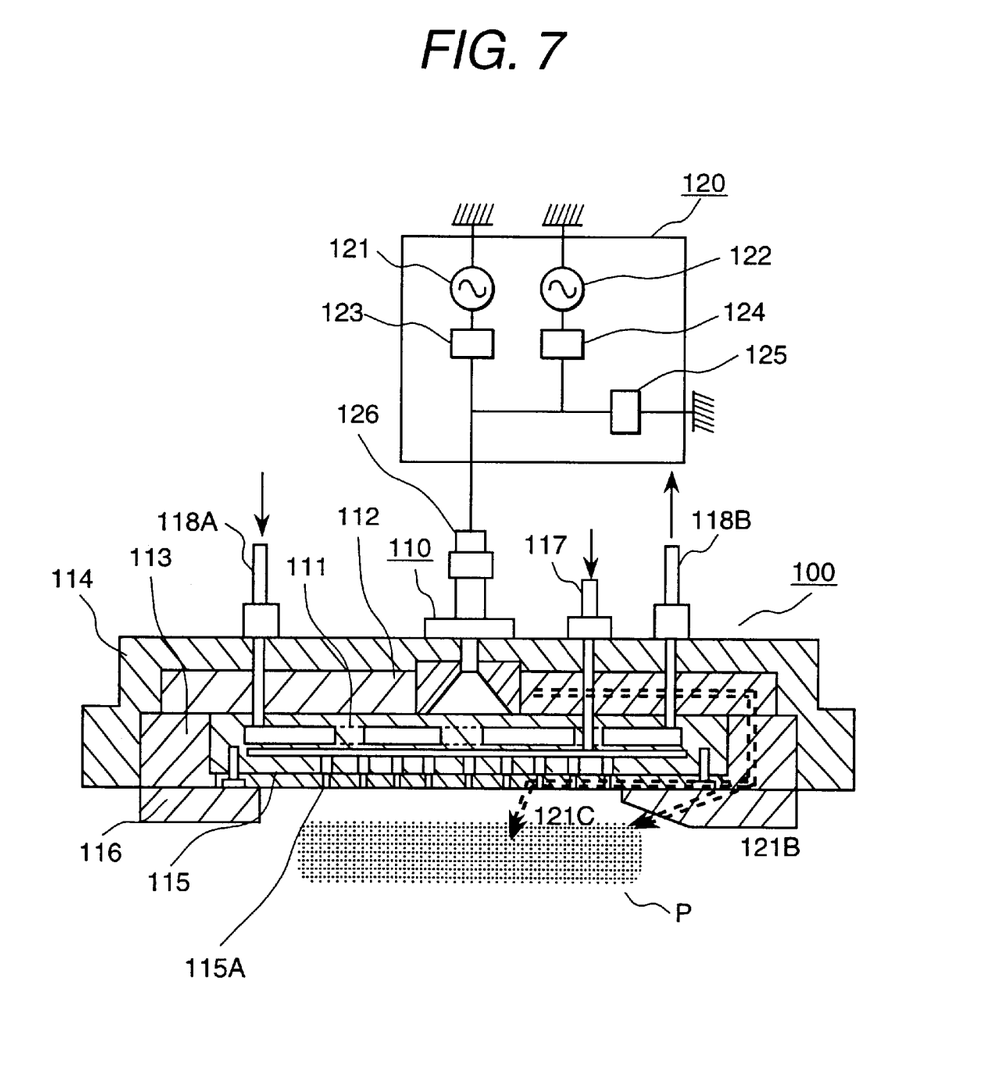
FIG. 7 is a schematic diagram representing the vertical section of the second Embodiment where the present invention is applied to a magnetic field UHF band electromagnetic wave radiation discharge type plasma processing apparatus.

In the Embodiment given in FIG. 2, heat transfer efficiency between the disk formed conductor 111 and the plate 115 is highly ensured by the process gas accumulated in space 111A, which is settled on the plasma-side surface of the disk formed conductor 111. Thereby accuracy of temperature control of the plate 115 is ensured, resulting in that the temperature fluctuation of the plate 115 during discharge on/off operation is kept within about ±5° C. around at 115° C., as is shown in FIGS. 4 and 5. As can be easily supposed from the result of FIG. 3, the surface reaction at the plate 115 can be stabilized sufficiently when the temperature fluctuation is about ±5° C. Moreover, when bias is applied, it is estimated that processing can be stabilized even under bigger temperature fluctuation, more concretely about ±25° C. In the following, experimental confirmation result will be described with reference to FIGS. 7 to 9:

FIG. 7 shows configuration of the second Embodiment used in the experiment. This configuration is almost the same as that of the first Embodiment shown in FIG. 2, however is different in the point that it does not provide any space between the disk formed conductor 111 and plate 115. In this configuration, because of lack of the space, which is effective for cooling of the plate 115 and for reduction of temperature fluctuations, the temperature of the plate 115 rises and temperature fluctuation increases. Temperature fluctuation of about ±25° C. around at 150° C. is assumed as the design value for the surface temperature of the plate 115. Furthermore, by increasing the thickness of the peripheral ring 116 to form a tapered interior, plasma generation efficiency is improved, with higher discharge of the UHF wave 121B, and diffusion of plasma is restricted. These effects result in increase of plasma P density.

Figure 8:
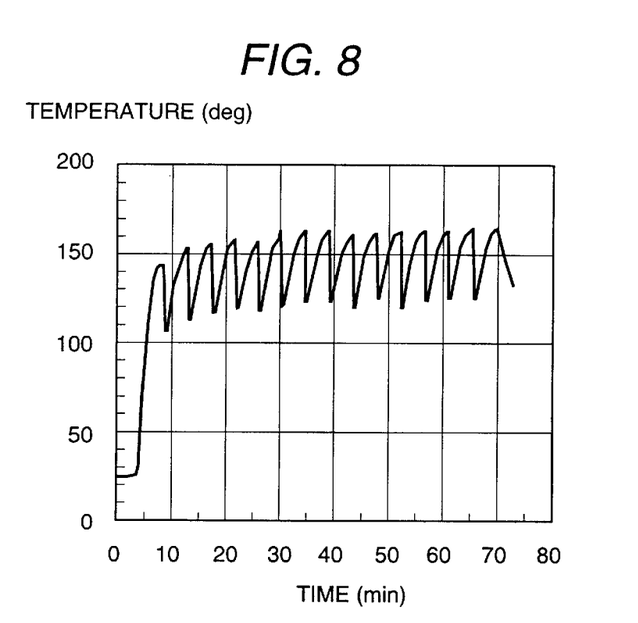
FIG. 8 represents the temperature fluctuation of the plate in the second Embodiment.

FIG. 8 shows temperature fluctuation of the plate 115 in this case. Processing conditions are the same as those described with reference to FIG. 3. In this case at steady state of 60 minutes after process starting, the temperature of the plate 115 increases by discharge on operation from 125 to 165° C. Namely, the discharge on/off operation results in temperature fluctuation of ±20° C. Then, change (or stability) of plasma and chemistry state in plasma in the presence of such temperature fluctuation was examined, on the basis of time dependent change of plasma optical emission and discharge characteristics. The result will be described below with reference to FIG. 9.

Figure 9:
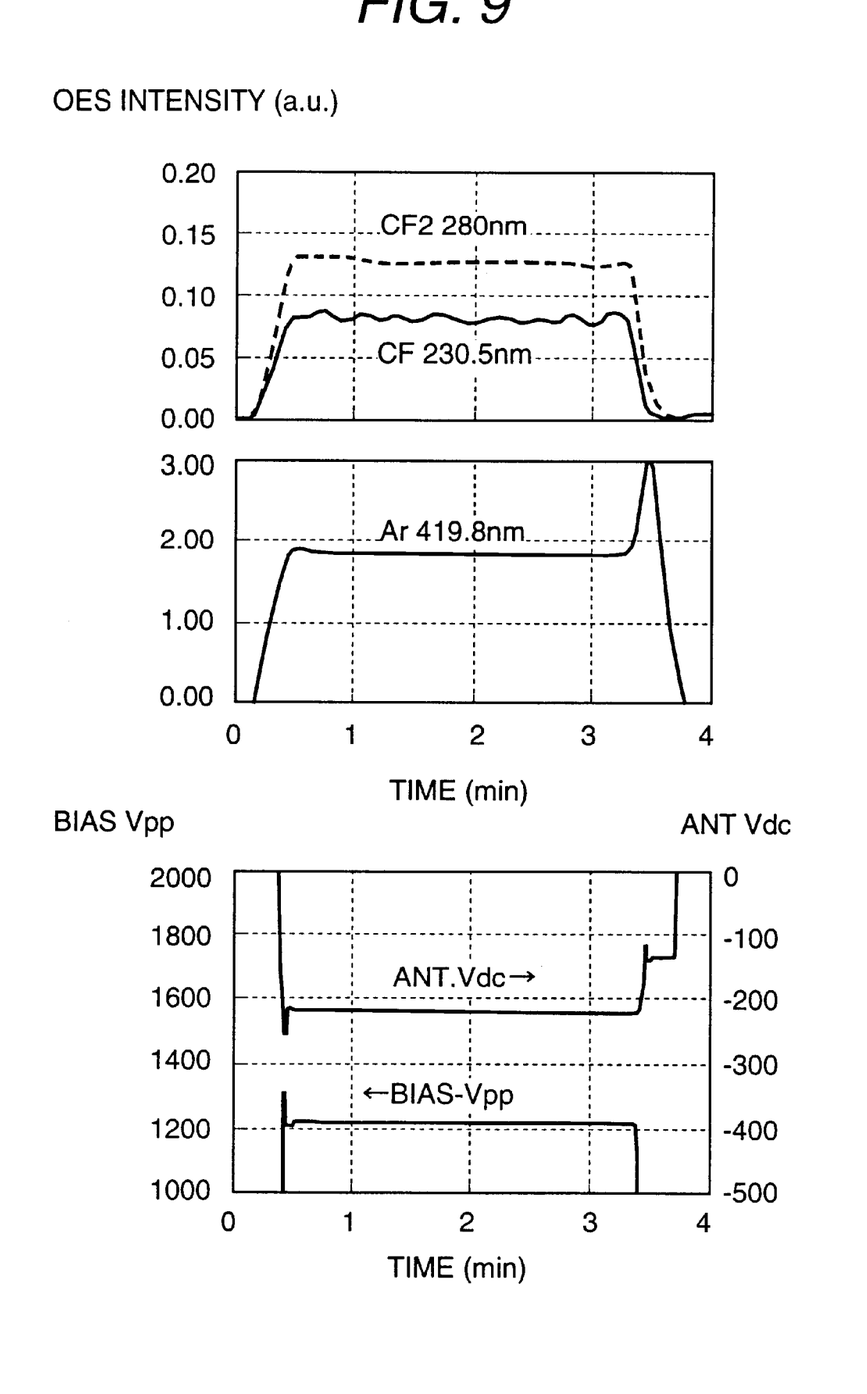
FIG. 9 represents the changes of plasma optical emission, discharge voltage and antenna bias voltage with time in the second Embodiment.

FIG. 9 represents time dependent change of plasma emission and discharge voltage (Bias-Vpp) and antenna bias (Ant.-Vdc) in one cycle of discharge-on. The plasma emission represents CF (230.5 nm), CF2 (280 nm) and Ar (419.8 nm). It is assumed that the CF and CF2 emissions represent radicals, namely, the state of chemistry in plasma, and the Ar emission denote ion density. The discharge voltage (Bias-Vpp) represents plasma density. Antenna bias (Ant.-Vdc) has influence on F scavenging reaction on the surface of silicon plate 115, namely, plasma chemistry. As can be seen from the result given in FIG. 9, all of emissions CF, CF2, Ar, discharge voltage Bias-Vpp and antenna bias Ant.-Vdc are stable during discharge-on operation, and influence of temperature fluctuation of the plate 115 is not observed. This result confirms that state of plasma and chemistry is stable for the temperature fluctuation of about ±25° C. It should be noted that fluctuation immediately before discharge-off operation is due to de-chucking step to release electrostatic chucking of the sample wafer, and is not caused by temperature fluctuation.

Figure 10:
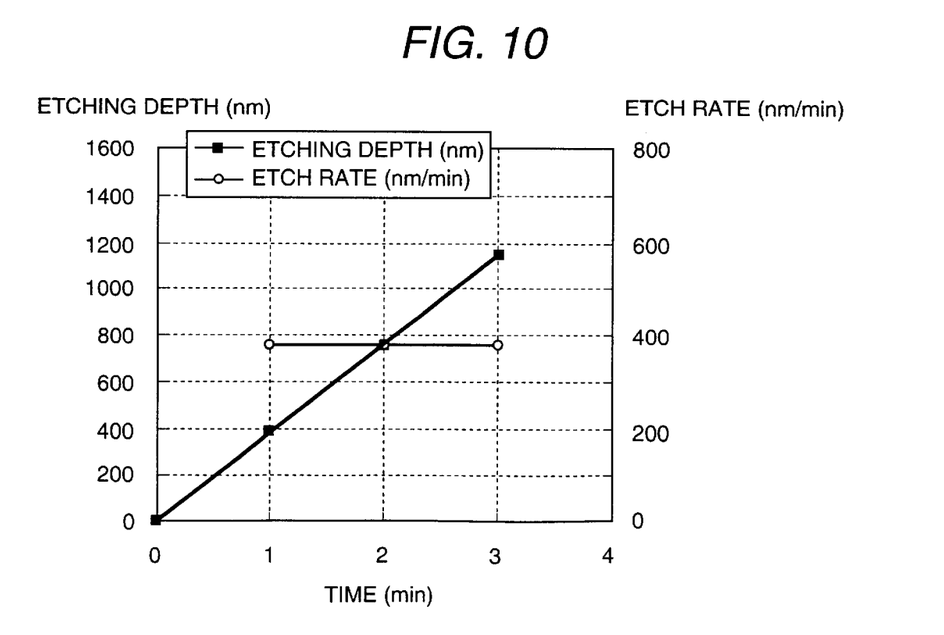
FIG. 10 represents the result of measuring the dependency of etching depth and etching rate upon etching time in the second Embodiment.

Furthermore, result of confirming process stability using the apparatus in the Embodiment given in FIG. 7 is shown in FIG. 10. FIG. 10 is the result of measuring dependency of etching depth and etching rate on a flat sample versus etching time. If the temperature fluctuation of the plate 115 affects etching characteristics, it should appear as fluctuation in linearity of etching depth or etching rate. As can be seen from FIG. 10, however, the etching depth increases in proportion to the etching time, and etching rate is constant independent of etching time. This shows that etching characteristics and plasma state as well are stable even for about ±25° C. temperature fluctuation of the plate 115.

The above description indicates process stability during one wafer etching. It goes without saying that the stable process repeatability is likewise ensured in continuous processing of one lot (25 wafers) or several lots of wafers. Furthermore, as an experimental result in continuous processing of thousands of wafers conducted with hole and SAC (Self-Alignment Contact) etching process using the plasma etching apparatus according to the present Embodiment, stable etching characteristics with excellent repeatability have been confirmed over 100 hours discharge operations.

The aforementioned Embodiments all indicate a plasma processing apparatus of a magnetic field UHF band electromagnetic wave radiation discharge type system, and have been described with UHF wave frequency fixed at 450 MHz. However, it goes without saying that the frequency used as electromagnetic wave to be radiated is not restricted thereto. In addition to the UHF band from 300 MHz to 1 GHz, the frequency may be, for example, microwave of 2.45 GHz or VHF band of several tens of MHz to 300 MHz. With respect to the magnetic field intensity, a case of 160 gauss is explained, which is electron cyclotron resonance magnetic field intensity for 450 MHz. However, it is not necessary to use resonance magnetic field, and stronger magnetic field or weaker one of several tens gauss or less may be used. Non magnetic field discharge type, without using the magnetic field, may also be utilized. In addition, process gas supply need not to be carried out from the plate 115. The gas may be supplied from the side wall, for example. Moreover, each of above mentioned Embodiments can be applied to a magnetron type plasma processing apparatus based on magnetic field, a parallel plate capacitively coupled plasma processing apparatus or inductively coupled plasma processing apparatus.

In the aforementioned Embodiments, the object to be processed is a semiconductor wafer and etching process for wafer is described. However, the present invention is not limited to it, and can be applied to a liquid crystal substrate, for example. The processing itself is not limited to etching; the present invention can be also applied to, for example, sputtering or CVD processing.

As explained above, according to the present inventions, by applying bias of Vdc=−300 to −50 V to the silicon-made plate 115 installed on the antenna opposite to the wafer, and by setting the temperature of the plate 115 in the range from 100 to 200° C. with the temperature fluctuation within 25° C., surface reaction on the plate 115 comes to stable and independent to temperature fluctuation, thus a plasma processing apparatus and processing method with excellent process stability and repeatability can be provided.

What is claimed is:

1. A plasma processing apparatus comprising;
 a vacuum chamber, a process gas supply means to supply gas to said vacuum chamber, an electrode to hold a sample processed inside said vacuum chamber, a plasma generator installed in said vacuum chamber opposite to said sample, and a vacuum exhaust system to decrease pressure of said vacuum chamber;
 wherein said plasma generator is installed a silicon-made plate inside the vacuum chamber, bias voltage of Vdc=−300 to −50 V is applied to said silicon-made plate, and the surface temperature of said plate is kept in the range from 100 to 200° C.

2. A plasma processing apparatus according to claim 1 further characterized in that fluctuation of the surface temperature of said silicon-made plate is kept within ±25° C.

3. A plasma processing apparatus according to any one of claims 1 and 2 further characterized in that said plasma generator is based on magnetic field or non-magnetic field UHF band electromagnetic wave radiation discharge method in the frequency range from 300 MHz to 1 GHz.

4. A plasma processing apparatus according any one of claims 1 and 2, further characterized in that the resistivity of said silicon-made plate is 1 to 20 Ωcm, and the thickness of said silicon-made plate is 5 to 20 mm.

5. A plasma processing apparatus according to any one of claims 1 and 2, further characterized in that said plasma processing apparatus comprises a conductor, a dielectric ring and an antenna constituting a part of the wall of said vacuum vessel; wherein said antenna has said silicon-made plate installed on the side of said dielectric ring in contact with plasma, and said dielectric ring has a temperature control means to keep a temperature of said dielectric ring at a value by an internally circulating heat transfer medium.

6. A plasma processing method for processing a sample using a plasma processing apparatus comprising; a vacuum chamber, a process gas supply means to supply gas to said vacuum chamber, an electrode to hold a sample processed inside said vacuum chamber, a plasma generator installed in said vacuum chamber opposite to said sample, and a vacuum exhaust system to decrease pressure of said vacuum chamber;
 wherein said plasma processing method comprising steps of;
 biasing voltage of Vdc=−300 to −50 V (−300 V≦Vdc≦−50 V) is applied to said silicon-made plate,
 controlling the surface temperature of said plate in the range from 100 to 200° C., and
 processing said sample by plasma generated from said plasma generator.

7. A plasma processing method for processing a sample by means of plasma generated inside said vacuum chamber by interaction between the electromagnetic wave radiated from the UHF band antenna installed inside the vacuum chamber and magnetic field produced by the magnetic field forming means installed around said vacuum chamber;
 wherein said plasma processing method comprising steps of;
 applying bias Vdc=−300 to −50 V to a silicon-made plate installed on said antenna opposite to said sample,
 controlling the resistivity of said silicon-made plate 1 to 10 Ωcm,
 raising the temperature by self-heat generation caused by internal resistance,
 controlling the temperature of said plate within ±25° C. in the range of said plate temperature from 100 to 200° C.

8. A plasma processing apparatus according to claim 4, characterized in that the resistivity of said silicon-made plate is 1 to 10 Ωcm.

9. A plasma processing apparatus according to claim 4, characterized in that the resistivity of said silicon-made plate is 1 to 5 Ωcm.

10. A plasma processing apparatus according to claim 4, characterized in that the thickness of said silicon-made plate is 5 to 10 mm.

* * * * *